US011881441B2

(12) United States Patent
Gogineni et al.

(10) Patent No.: US 11,881,441 B2
(45) Date of Patent: Jan. 23, 2024

(54) STACKED DIE SEMICONDUCTOR PACKAGE SPACER DIE

(71) Applicant: Intel Corporation, Santa Clara, CA (US)

(72) Inventors: Sireesha Gogineni, Folsom, CA (US); Andrew Kim, Folsom, CA (US); Yong She, Songjiang (CN); Karissa J. Blue, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/642,815

(22) PCT Filed: Sep. 29, 2017

(86) PCT No.: PCT/US2017/054588
§ 371 (c)(1),
(2) Date: Feb. 27, 2020

(87) PCT Pub. No.: WO2019/066960
PCT Pub. Date: Apr. 4, 2019

(65) Prior Publication Data
US 2020/0350227 A1 Nov. 5, 2020

(51) Int. Cl.
*H01L 23/373* (2006.01)
*H01L 23/00* (2006.01)
(Continued)

(52) U.S. Cl.
CPC .......... *H01L 23/3738* (2013.01); *H01L 24/73* (2013.01); *H01L 25/0652* (2013.01);
(Continued)

(58) Field of Classification Search
CPC ............. H01L 25/0657; H01L 25/0652; H01L 2225/06568
See application file for complete search history.

(56) References Cited

U.S. PATENT DOCUMENTS 6,008,536 A * 12/1999 Mertol .................. H01L 23/367
257/713
2002/0180023 A1 12/2002 Her
(Continued)

FOREIGN PATENT DOCUMENTS

KR 10-2005-0114033 12/2005

OTHER PUBLICATIONS

International Search Report and Written Opinion for International Patent Application No. PCT/US2017/054588, dated Apr. 9, 2020, 9 pgs.
(Continued)

*Primary Examiner* — Yu-Hsi D Sun
(74) *Attorney, Agent, or Firm* — Schwabe, Williamson & Wyatt, P.C.

(57) ABSTRACT

Stacked die semiconductor packages may include a spacer die disposed between stacked dies in the semiconductor package and the semiconductor package substrate. The spacer die translates thermally induced stresses on the solder connections between the substrate and an underlying member, such as a printed circuit board, from electrical structures communicably or conductively coupling the semiconductor package substrate to the underlying structure to mechanical structures that physically couple the semiconductor package to the underlying structure. The footprint area of the spacer die is greater than the sum of the footprint areas of the individual stacked dies in the semiconductor package and less than or equal to the footprint area of the semiconductor package substrate. The spacer die may have nay physical configuration, thickness, shape, or geometry. The spacer die may have a coefficient of thermal expansion similar to that of the lowermost semiconductor die in the die stack.

9 Claims, 7 Drawing Sheets

(51) Int. Cl.
   *H01L 25/065*   (2023.01)
   *H01L 25/18*    (2023.01)
   *H01L 25/00*    (2006.01)

(52) U.S. Cl.
   CPC .......... *H01L 25/0657* (2013.01); *H01L 25/18* (2013.01); *H01L 25/50* (2013.01); *H01L 2224/73265* (2013.01); *H01L 2225/0651* (2013.01); *H01L 2225/06506* (2013.01); *H01L 2225/06568* (2013.01)

(56)              References Cited

U.S. PATENT DOCUMENTS

| 2005/0285260 | A1  |   | 12/2005 | Hackitt et al. |
| 2006/0055018 | A1  |   | 3/2006  | Sekiguchi et al. |
| 2006/0273441 | A1  |   | 12/2006 | Chung |
| 2007/0001284 | A1  | * | 1/2007  | Kim .................. H05K 3/3463 |
|              |     |   |         | 257/E23.072 |
| 2009/0236752 | A1  | * | 9/2009  | Lee ..................... H01L 24/97 |
|              |     |   |         | 257/777 |
| 2018/0122771 | A1  | * | 5/2018  | Park .................. H01L 25/0652 |

OTHER PUBLICATIONS

International Preliminary Report on Patentability for International Patent Application No. PCT/US2017/054588, dated Apr. 28, 2018, 10 pgs.

\* cited by examiner

STACKED DIE SEMICONDUCTOR PACKAGE SPACER DIE

CROSS-REFERENCE TO RELATED APPLICATIONS

This patent application is a U.S. National Phase Application under 35 U.S.C. § 371 of International Application No. PCT/US2017/054588, filed on Sep. 29, 2017, the entire contents of which is hereby incorporated by reference herein.

TECHNICAL FIELD

The present disclosure relates to semiconductor packaging.

BACKGROUND

The increasing demand for smaller form factor portable electronic devices reduces the available board space for semiconductor packages. Consequently, designers turn to stacked die packages to free board space by extending dies into a third, vertical, dimension (i.e., the stacked die semiconductor package). The structure produced by laminating a number of semiconductor dies to form a semiconductor package tends to deteriorate the solder joint connection between the semiconductor package and the printed circuit board (PCB) as a consequence of the thermal cycling of the semiconductor package during normal operation and use of the device. In particular, solder joint failure has been noted to occur more frequently at die edge regions where the solder joints are positioned beneath the die edge of the bottommost die in the die stack.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1A:
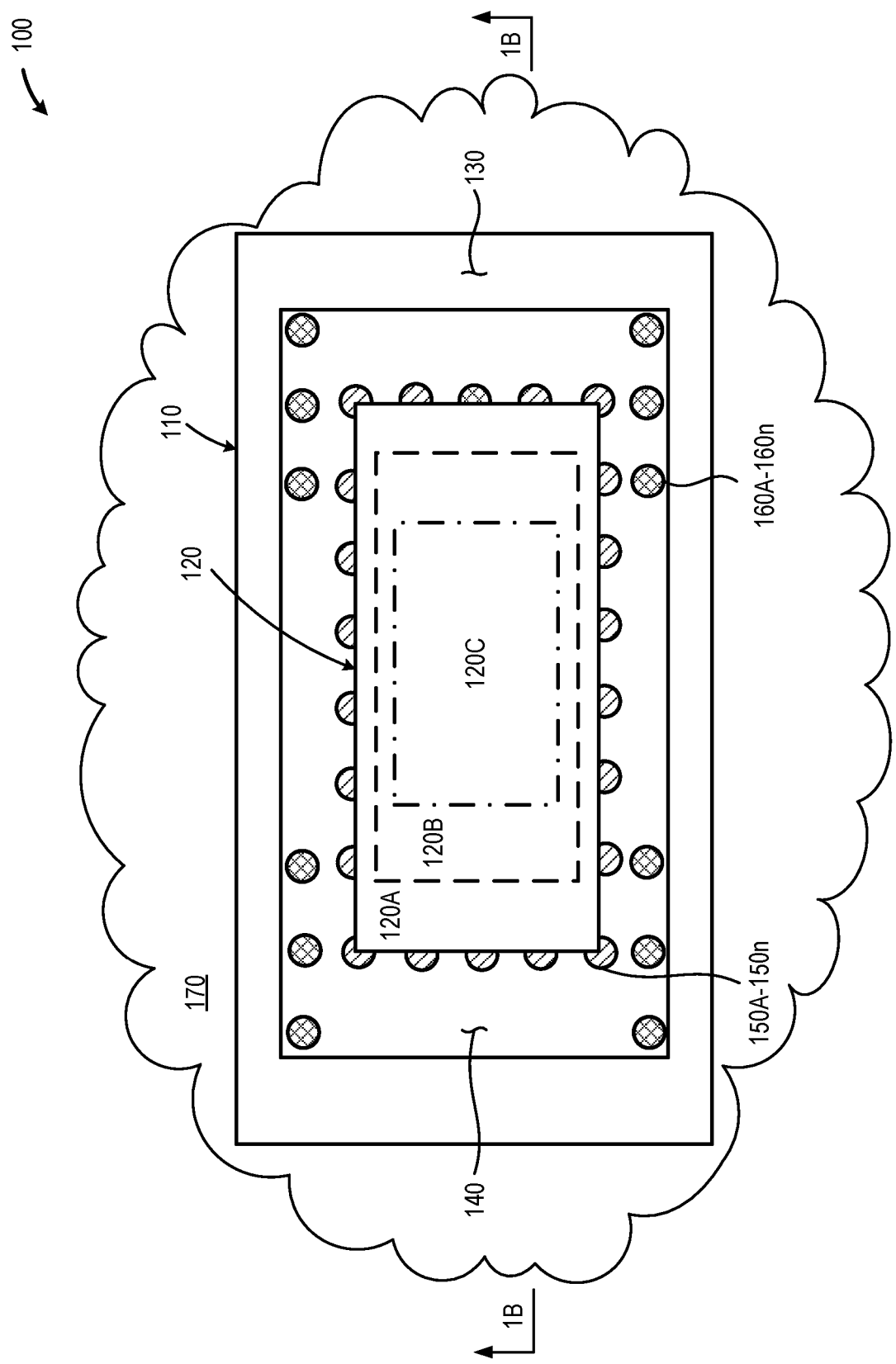
FIG. 1A is a plan view of an illustrative semiconductor package that includes a die stack, a package substrate, and a spacer die disposed between the die stack and the package substrate, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

A stacked die semiconductor package includes a number of semiconductor dies physically coupled and wirebonded to contact pads on a substrate. An encapsulant, typically a dielectric material covers, seals, and protects the die stack. During operation, the die stack generates heat as a result of electric current flowing through the dies included in the stack. The difference in the coefficient of thermal expansion of the silicon used to form the semiconductor die and the laminated organic dielectrics and metals used to form the underlying printed circuit board exerts a shear stress on the solder joints physically and electrically coupling the package to the printed circuit board. This shear stress is particularly pronounced on solder joints along the edge of the lowermost semiconductor die in the stacked semiconductor package. The shear stress is sufficient to fracture the solder joints, causing unreliable device operation and/or premature device failure.

The systems and methods disclosed herein employ a spacer positioned between the lowermost semiconductor die and the semiconductor package substrate to relieve the stress on the solder joints positioned immediately beneath one or more edges of the lowermost semiconductor die in the stacked die semiconductor package. The spacer translates the stress typically placed on functional solder connections beneath the stacked semiconductor dies to non-functional mechanical sacrificial solder connections positioned outside the perimeter of the lowermost semiconductor die but inside the perimeter of the stacked die semiconductor package. The use of the spacer beneath the lowermost semiconductor die in a stacked die semiconductor package has been found to beneficially and advantageously provide a 2 to 3 fold improvement in solder joint reliability. The use of a spacer between the substrate and the semiconductor die stack beneficially and advantageously eliminates the need for costly and time-consuming underfill beneath the semiconductor package. Further, the spacer may be inserted between the substrate and the semiconductor die stack using current manufacturing processes and techniques.

A semiconductor package is provided. The semiconductor package may include: a substrate having an upper surface, a transversely opposed second surface, and a substrate footprint area and a contact pad array disposed on the second surface of the substrate; where the contact pad array includes a plurality of contact pads arranged in a first pattern; and where the first pattern includes a plurality of peripheral contact pads; a first die stack having a first die stack footprint area; the first die stack footprint area less than the substrate footprint area; and a spacer die disposed between the upper surface of the substrate and first die stack the spacer die having a footprint area that is greater than the first die stack footprint area and the same or smaller than the substrate footprint area; where the first die stack communicably couples to the upper surface of the spacer die in a location such that the first die stack footprint area partially shadows a portion of the plurality of peripheral contact pads; and where the spacer die footprint area completely shadows the portion of the plurality of peripheral contact pads at least partially shadowed by the first die stack footprint.

A semiconductor package fabrication method is provided. The method may include: disposing a spacer die between a first die stack and a first surface of a substrate such that a first die stack footprint partially shadows a portion of each of a plurality of contact pads disposed on a second surface of the substrate; coupling the first die stack to a first side of the spacer die, the spacer die having a footprint that is greater than the first die stack footprint; and coupling the substrate to a second side of the spacer die, the second side of the spacer die transversely opposed to the first side of the spacer die, the spacer die having a footprint that is the same or smaller than the substrate footprint, the spacer die footprint shadowing the plurality of contact pads at least partially shadowed by the footprint of the first die stack.

A semiconductor package fabrication system is provided. The system may include: means for disposing a spacer die between a first die stack and a first surface of a substrate such that a first die stack footprint partially shadows a portion of each of a plurality of contact pads disposed on a second surface of the substrate; means for coupling the first die stack to a first side of the spacer die, the spacer die having a footprint that is greater than the first die stack footprint; and means for coupling the substrate to a second side of the spacer die, the second side of the spacer die transversely opposed to the first side of the spacer die, the spacer die having a footprint that is the same or smaller than the substrate footprint, the spacer die footprint shadowing the plurality of contact pads at least partially shadowed by the footprint of the first die stack.

An electronic device is provided. The electronic device may include: a printed circuit board; and a semiconductor package communicably coupled to the printed circuit board, the semiconductor package including: a substrate having an upper surface, a transversely opposed second surface, and a substrate footprint area and a contact pad array disposed on the second surface of the substrate; where the contact pad array includes a plurality of contact pads arranged in a first pattern; and where the first pattern includes a plurality of peripheral contact pads; a first die stack having a first die stack footprint area; the first die stack footprint area less than the substrate footprint area; and a spacer die disposed between the upper surface of the substrate and first die stack the spacer die having a footprint area that is greater than the first die stack footprint area and the same or smaller than the substrate footprint area; where the first die stack communicably couples to the upper surface of the spacer die in a location such that the first die stack footprint area partially shadows a portion of the plurality of peripheral contact pads; and where the spacer die footprint area completely shadows the portion of the plurality of peripheral contact pads at least partially shadowed by the first die stack footprint.

As used herein the terms "top," "bottom," "upper," "lower," "lowermost," and "uppermost" when used in relationship to one or more elements are intended to convey a relative rather than absolute physical configuration. Thus, an element described as an "upper film layer" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "logically associated" when used in reference to a number of objects, systems, or elements, is intended to convey the existence of a relationship between the objects, systems, or elements such that access to one object, system, or element exposes the remaining objects, systems, or elements having a "logical association" with or to the accessed object, system, or element. An example "logical association" exists between relational databases where access to an element in a first database may provide information and/or data from one or more elements in a number of additional databases, each having an identified relationship to the accessed element. In another example, if "A" is logically associated with "B," accessing "A" will expose or otherwise draw information and/or data from "B," and vice-versa.

Figure 1B:
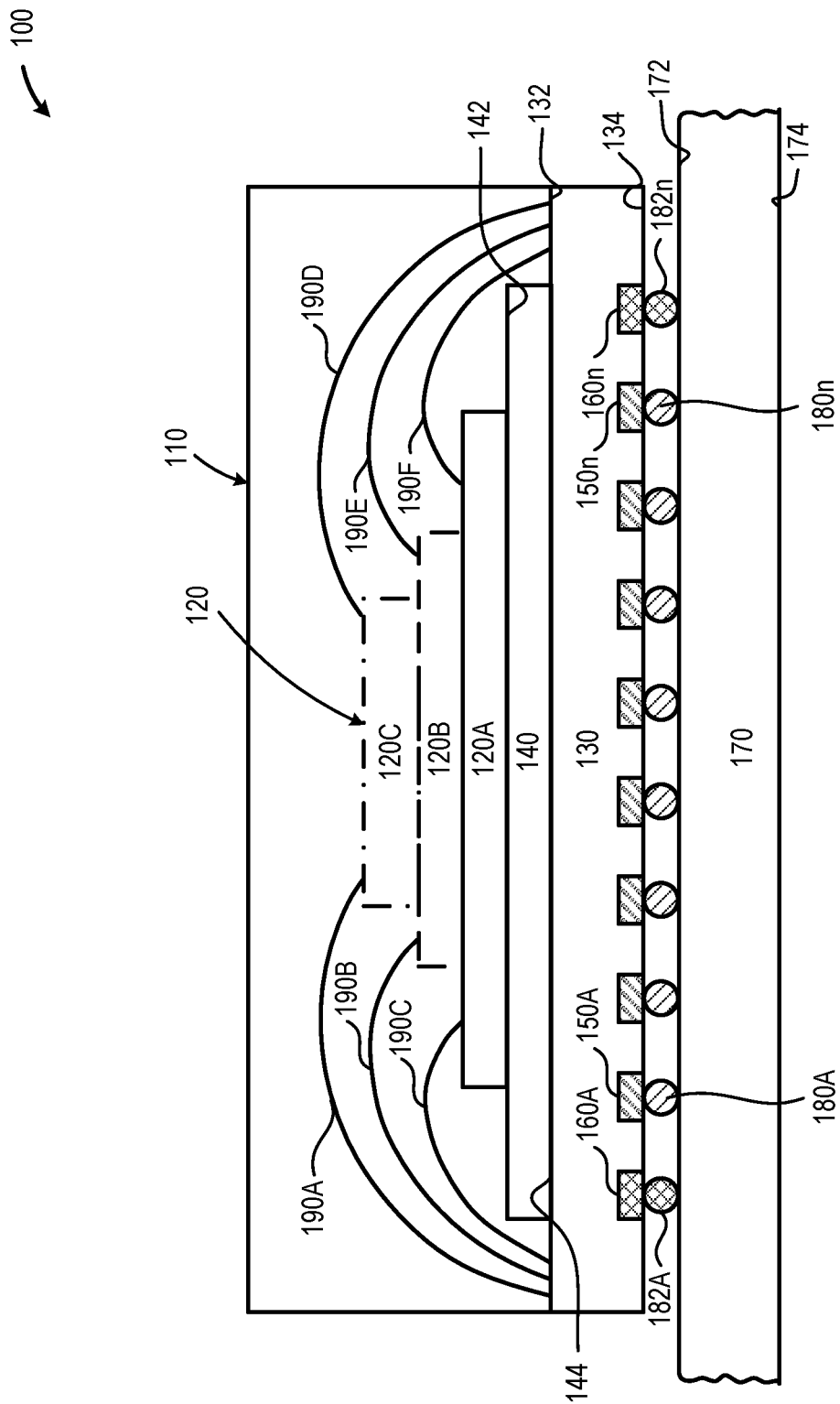
FIG. 1B is a cross-sectional elevation of the semiconductor package depicted in FIG. 1A along section line 1B-1B, in accordance with at least one embodiment described herein.

FIG. 1A is a plan view of an illustrative semiconductor package 110 that includes a die stack 120, a package substrate 130, and a spacer die 140 disposed between the die stack 120 and the package substrate, in accordance with at least one embodiment described herein. FIG. 1B is a cross-sectional elevation of the semiconductor package depicted in FIG. 1A along section line 1B-1B, in accordance with at least one embodiment described herein. The die stack 120 includes three illustrative semiconductor dies 120A, 120B, and 120C. Although three stacked semiconductor dies 120A-120C are depicted in FIG. 1A, those of skill in the relevant arts will readily appreciate that any number of semiconductor dies may be similar stacked and such stacked die packages should be considered within the scope of this disclosure. Wirebonds 190A-190n (collectively, "wirebonds 190") communicably couple each of the semiconductor dies 120 to the semiconductor package substrate 130. The semiconductor package substrate 130 may include a number of electrical devices, semiconductor components, logic devices or similar components that link the wirebonds 190 to contact pads disposed on the lower surface 134 of the semiconductor package substrate 130. In embodiments, the semiconductor package substrate 130 may include one or more redistribution layers As depicted in FIGS. 1A and 1B, a plurality of electrical contact pads 150A-150n (collectively, "electrical contact pads 150"—depicted as single cross-hatch in FIGS. 1A and 1B) are disposed on, about, or across the lower surface 134 of the semiconductor package substrate 130. Also as depicted in FIGS. 1A and 1B, a plurality of mechanical contact pads 160A-160n (collectively, "mechanical contact pads 160"—depicted as double cross-hatch in FIGS. 1A and 1B) are disposed on, about, or across the lower surface 134 of the semiconductor package substrate 130. A plurality of solder balls, solder bumps, or similar conductive structures 180A-180n (collectively, "conductive structures 180") are conductively and/or communicably coupled to at least a portion of the electrical contact pads 150. Similarly, a plurality of solder balls, solder bumps, conductive adhesives, non-conductive adhesives or similar mechanical structures 182A-182n (collectively, "mechanical structures 182") are physically coupled to at least a portion of the mechanical contact pads 160.

The conductive structures 180 may communicably and/or electrically couple the die stack 120 to the underlying structure 170. The mechanical structures 182 may mechanically affix and/or physically couple the stacked die semiconductor package 110 to the underlying structure 170. In embodiments, at least a portion of the mechanical structures 182 may electrically and/or conductively couple the stacked die semiconductor package 110 to the underlying printed circuit board 170. Both the conductive structures 180 and the mechanical structures 182 physically affix the stacked die semiconductor package 110 to an underlying structure 170, such as a printed circuit board.

One or more die attach adhesives, die attach adhesive films, or similar substances (not visible in FIGS. 1A and 1B) physically bond the semiconductor dies 120A-120n forming the stacked semiconductor package 110. The semiconductor dies 120 typically include semiconductor devices formed in a silicon wafer. The coefficient of thermal expansion for silicon is about 2 parts per million per degree Centigrade (ppm/C). The die attach adhesive and/or die attach adhesive film used to bond the semiconductor dies 120 together accommodates the thermal expansion of the semiconductor dies 120 forming the stacked semiconductor package 110.

In embodiments, the one or more die attach adhesive and/or die attach film may have a first modulus of elasticity and the spacer die 140 may have a second modulus of elasticity. In embodiments, the difference between the first modulus of elasticity and the second modulus of elasticity may be: less than 5%; less than 10%; less than 15%; less than 20%; or less than 25% of the larger of the first modulus of elasticity or the second modulus of elasticity.

In contrast, the coefficient of thermal expansion for the organic epoxies and similar materials used to fabricate the underlying structure 170 (e.g., a printed circuit board 170) are significantly greater, ranging from 15 ppm/C to 20 ppm/C. The differential thermal expansion places the outermost conductive structures 180 in horizontal shear. After repeated thermal cycling, the shear caused by the differential expansion of the stacked semiconductor package 110 and the underlying structure 170 causes at least some of the conductive structures 180 to fracture, compromising the performance of the stacked semiconductor package 110. In the absence of a spacer die 140, the conductive structures along the edges of the lowermost semiconductor die 120A are subjected to the greatest shear and are the most likely conductive structures 180 to fail. Since the conductive structures 180 beneath the lowermost semiconductor die 120A are used for communication between the stacked semiconductor package 110 and the underlying structure 170, a failure of even just one conductive structure 170 can cause the stacked semiconductor package 110 to fail.

Inserting the spacer die 140 between the lowermost semiconductor die 120A and the upper surface 132 of the semiconductor package substrate 130 beneficially transfers the horizontal shear generated by the differential thermal expansion of the spacer die 140 with respect to the underlying structure 170 from the conductive structures 180 to the mechanical structures 182. Since the mechanical structures 182 are generally not used for electrical communication between the semiconductor package 110 and the underlying structure 170, fracturing of the mechanical structures 182 does not cause a failure of the semiconductor package 110. In embodiments, the lowermost semiconductor die 120A may be physically coupled to the upper surface 142 of the spacer die 140 using one or more die attach adhesives or die attach adhesive films.

The spacer die 140 may be fabricated using any material or combination of materials having a coefficient of thermal expansion similar to that of silicon and/or the die attach adhesive or adhesive film used to bond the lowermost semiconductor die 120A to the upper surface 142 of the spacer die 140. In embodiments, the spacer die 140 may include a silicon member. In embodiments, the spacer die 140 may have a footprint having dimensions and/or an area greater than the footprint dimensions and/or area of the lowermost semiconductor die 120A. In embodiments, the spacer die 140 may have a footprint having dimensions and/or an area less than the footprint dimensions and/or area of the semiconductor package substrate 130. The spacer die 140 may have any physical size, shape, or geometry. In embodiments, the spacer die may have an irregular polygonal shape based on the footprint of the lowermost semiconductor die 120A and/or the configuration of the mechanical contact pads 160 disposed on the lower surface 134 of the semiconductor package substrate 130. In embodiments, the spacer die 140 may have a thickness of: less than 5 micrometers (μm); less than 10 μm; less than 25 μm; less than 50 μm; less than 100 μm; less than 250 μm; less than 500 μm; or less than 1 millimeter (mm). In some implementations, the spacer die 140 may include one a silicon member having or more through silicon vias to electrically and/or communicably couple the lowermost semiconductor die 120A to the semiconductor package substrate 130.

As used herein, the term "footprint" refers to a contact patch or area created by the lower surface of a top member when positioned on the upper surface of a bottom member. For example, the footprint of a square or rectangle may be determined by length×width. In another example, the footprint of a sphere is the point of contact between the sphere and an underlying surface. In another example, the footprint of a vertical conical frustum may be determined by pi ($\pi$) times the radius of the portion of the conic section placed on an underlying surface.

In some implementations, the spacer die 140 may be fabricated with the semiconductor package substrate 130. For example, the spacer die 140 may be physically coupled to the upper surface 134 of the semiconductor package substrate 130. Such construction advantageously permits the thinning of the spacer die 140 since the semiconductor package substrate 130 provides support and rigidity to the spacer die 140 during the thinning process. In other implementations, the spacer die 140 may be physically affixed or otherwise coupled to the lowermost die 120A in the die stack 120 prior to attaching, affixing, or physically coupling the die stack 120 to the semiconductor package substrate 130.

Figure 2A:
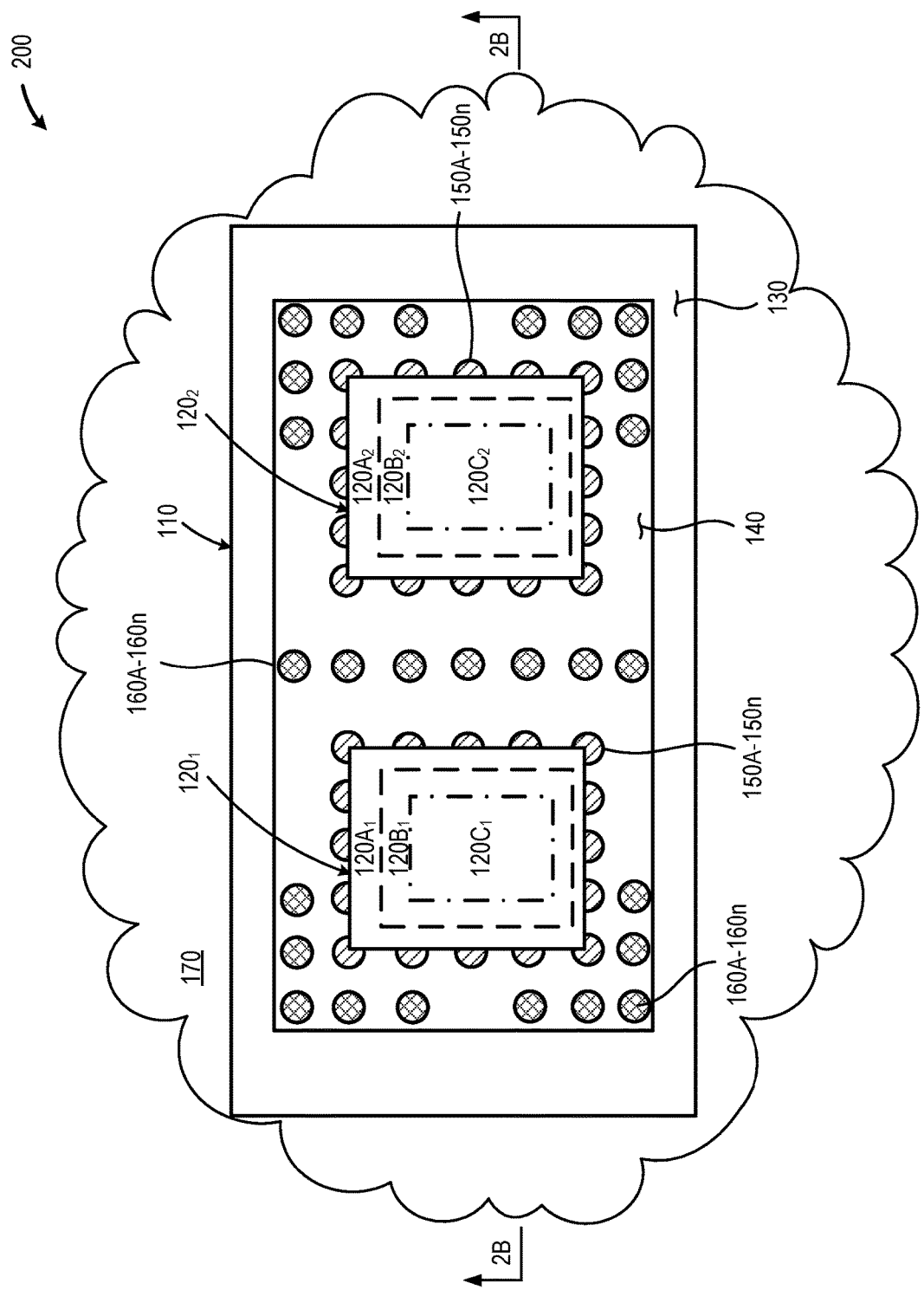
FIG. 2A is a plan view of an illustrative system that includes a semiconductor package having a first die stack, a second die stack, a semiconductor package substrate, and a spacer die disposed between the die stacks and the semiconductor package substrate, in accordance with at least one embodiment described herein.
Figure 2B:
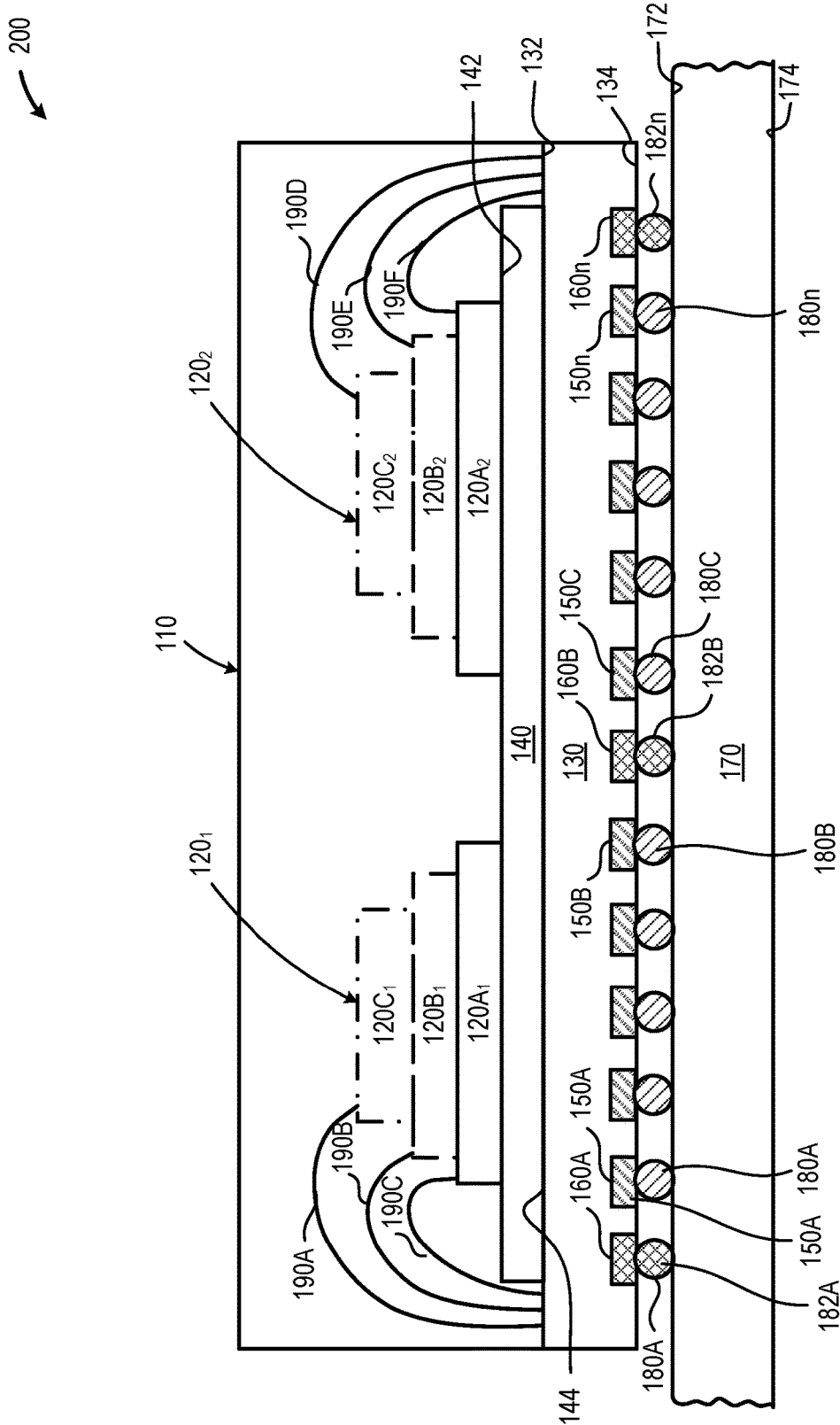
FIG. 2B is a cross-sectional elevation of the illustrative semiconductor package depicted in FIG. 2A along section line 2B-2B, in accordance with at least one embodiment described herein.

FIG. 2A is a plan view of an illustrative system 200 that includes a semiconductor package 110 having a first die stack $120_1$, a second die stack $120_2$ (collectively, "die stacks 120"), a semiconductor package substrate 130, and a spacer die 140 disposed between the die stacks 120 and the semiconductor package substrate 130, in accordance with at least one embodiment described herein. FIG. 2B is a cross-sectional elevation of the illustrative semiconductor package 200 depicted in FIG. 2A along section line 2B-2B, in accordance with at least one embodiment described herein. The first die stack $120_1$ includes three illustrative semiconductor dies 120A$_1$, 120B$_1$, and 120C$_1$. The second die stack 120$_2$ includes three illustrative semiconductor dies 120A$_2$, 120B$_2$, and 120C$_1$. Although depicted in FIGS. 2A and 2B as having the same number of stacked silicon dies 120, in embodiments, the die stacks may have an equal or an unequal number of stacked semiconductor dies 120. Although depicted in FIGS. 2A and 2B as having two die stacks 120, the semiconductor package 200 may have any number of die stacks 120. Wirebonds 190A-190n (collectively, "wirebonds 190") communicably couple the semiconductor dies 120 to the semiconductor package substrate 130. The semiconductor package substrate 130 may include a number of electrical devices, semiconductor components, logic devices or similar components that link the wirebonds 190 to contact pads disposed on the lower surface 134 of the semiconductor package substrate 130. In embodiments, the semiconductor package substrate 130 may include one or more redistribution layers.

As depicted in FIGS. 2A and 2B electrical contact pads 150 may be disposed partially beneath one or more edges of the lowermost semiconductor die 120A$_1$ of the first die stack 120$_1$ and/or partially beneath one or more edges of the lowermost semiconductor die 120A$_2$ of the second die stack 120$_2$. One or more mechanical contact pads 160A-160n may be disposed in, on, about, or across the lower surface 134 of the semiconductor package substrate 130, positioned in one or more interstitial spaces between the die stacks 120.

The spacer die 140 may have nay physical size, shape, or configuration to accommodate the placement of the die stacks 120 in the semiconductor package 110. The spacer die 140 may have any size, shape, geometry, or physical configuration to span the electrical contact pads 150 positioned beneath an edge (i.e., the footprint of) of each of the lowermost semiconductor dies 120A in each of the die stacks 120 such that the shear stress developed during thermal cycling of some or all of the die stacks is translated to mechanical contact pads 160 positioned inside the perimeter of the semiconductor package 110.

Figure 3:
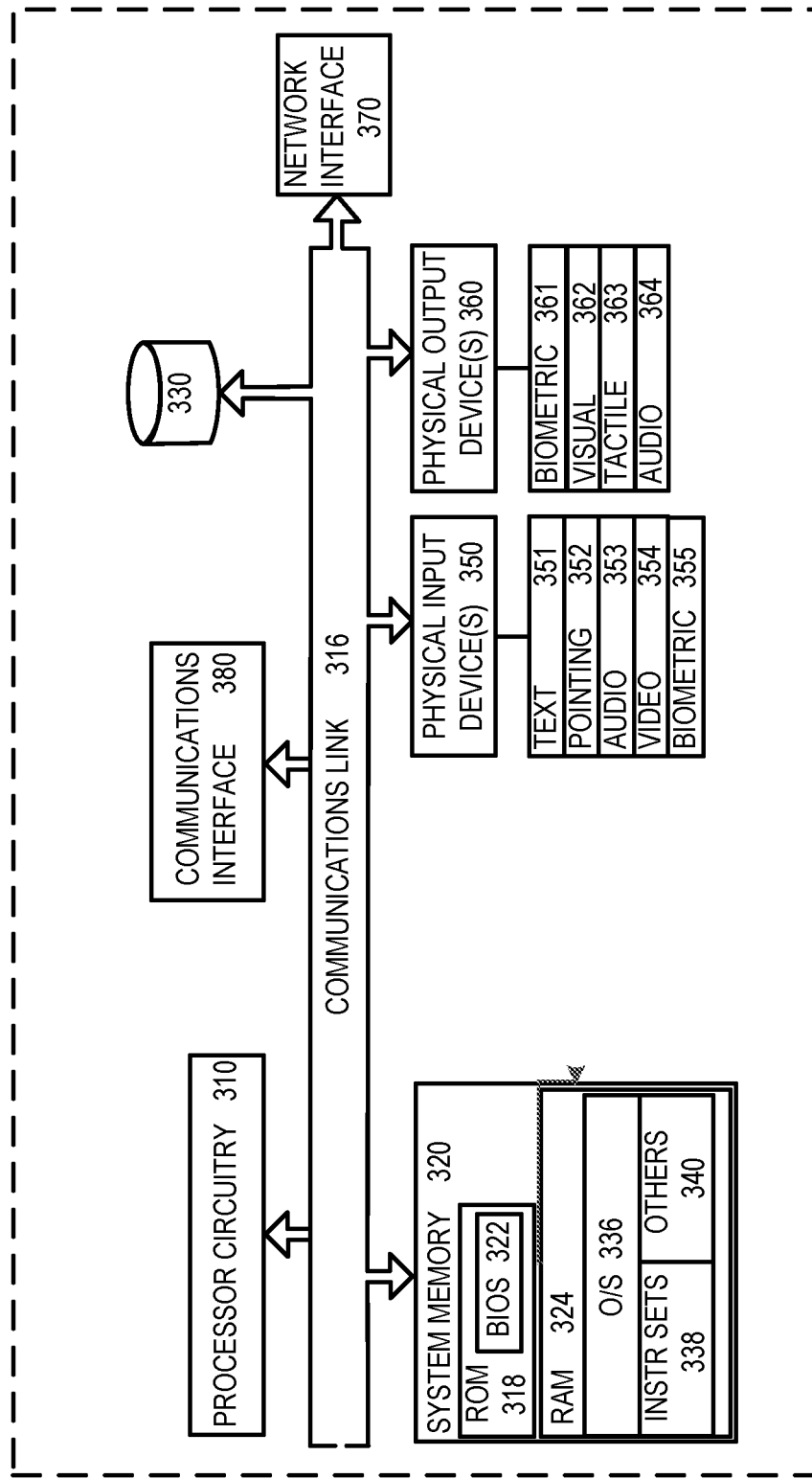
FIG. 3 is a block diagram of an illustrative processor-based device equipped with at least one stacked semiconductor package that includes a spacer die such as described above in FIGS. 1A and 1B and/or at least one stacked semiconductor package that includes a spacer die such as described above in FIGS. 2A and 2B, in accordance with at least one embodiment described herein.

FIG. 3 is a block diagram of an illustrative processor-based device 300 equipped with at least one stacked semiconductor package 100 that includes a spacer die 140 such as described above in FIGS. 1A and 1B and/or at least one stacked semiconductor package 200 that includes a spacer die 140 such as described above in FIGS. 2A and 2B, in accordance with at least one embodiment described herein. The following discussion provides a brief, general description of the components forming the illustrative processor-based device 300 such as a smartphone, wearable computing device, portable computing device, or similar device containing a stacked semiconductor package 100 or a multi-stacked die semiconductor package 200 equipped with at least one spacer die 140.

The processor-based device 300 includes processor circuitry 310 capable of executing machine-readable instruction sets, reading data from the a storage device 330 and writing data to the storage device 330. Those skilled in the relevant art will appreciate that the illustrated embodiments as well as other embodiments can be practiced with other circuit-based device configurations, including portable electronic or handheld electronic devices, for instance smartphones, portable computers, wearable computers, microprocessor-based or programmable consumer electronics, personal computers ("PCs"), network PCs, minicomputers, mainframe computers, and the like.

The processor circuitry 310 may include any number of hardwired or configurable circuits, some or all of which may include programmable and/or configurable combinations of electronic components, semiconductor devices, and/or logic elements that are disposed partially or wholly in a PC, server, or other computing system capable of executing machine-readable instructions. The processor-based device 300 includes the processor circuitry 310 and bus or similar communications link 316 that communicably couples and facilitates the exchange of information and/or data between various system components including a system memory 320, one or more rotating data storage devices 330, and/or one or more 3D NAND-based storage devices 100. The processor-based device 300 may be referred to in the singular herein, but this is not intended to limit the embodiments to a single device and/or system, since in certain embodiments, there will be more than one processor-based device 300 that incorporates, includes, or contains any number of communicably coupled, collocated, or remote networked circuits or devices.

The processor circuitry 310 may include any number, type, or combination of devices. At times, the processor circuitry 310 may be implemented in whole or in part in the form of semiconductor devices such as diodes, transistors, inductors, capacitors, and resistors. Such an implementation may include, but is not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), field programmable gate arrays (FPGAs), and the like. Unless described otherwise, the construction and operation of the various blocks shown in FIG. 3 are of conventional design. Consequently, such blocks need not be described in further detail herein, as they will be understood by those skilled in the relevant art. The communications link 316 that interconnects at least some of the components of the processor-based device 300 may employ any known serial or parallel bus structures or architectures.

The system memory 320 may include read-only memory ("ROM") 318 and random access memory ("RAM") 324. A portion of the ROM 318 may be used to store or otherwise retain a basic input/output system ("BIOS") 322. The BIOS 322 provides basic functionality to the processor-based device 300, for example by causing the processor circuitry 310 to load one or more machine-readable instruction sets. In embodiments, at least some of the one or more machine-readable instruction sets cause at least a portion of the processor circuitry 310 to provide, create, produce, transition, and/or function as a dedicated, specific, and particular machine, for example a word processing machine, a digital image acquisition machine, and similar. In some implementations all or a portion of the system memory 320 may be disposed in a common semiconductor package with the processor circuitry, such as a system-on-a-chip, or SoC.

The processor-based device 300 may include one or more communicably coupled, non-transitory, data storage devices, such as one or more hard disk drives 330. The one or more data storage devices 330 may include any current or future developed storage appliances, networks, and/or devices. Non-limiting examples of such data storage devices 330 may include, but are not limited to, any current or future developed non-transitory storage appliances or devices, such as one or more magnetic storage devices, one or more optical storage devices, one or more electro-resistive storage devices, one or more molecular storage devices, one or more quantum storage devices, or various combinations thereof. In some implementations, the one or more data storage devices 330 may include one or more removable storage devices, such as one or more flash drives, flash memories, flash storage units, or similar appliances or devices capable of communicable coupling to and decoupling from the processor-based device 300.

The one or more data storage devices 330 may include interfaces or controllers (not shown) communicatively coupling the respective storage device or system to the communications link 316. The one or more data storage devices 330 may store, retain, or otherwise contain machine-readable instruction sets, data structures, program modules, data stores, databases, logical structures, and/or other data useful to the processor circuitry 310 and/or one or more applications executed on or by the processor circuitry 310. In some instances, one or more data storage devices 330 may be communicably coupled to the processor circuitry 310, for example via communications link 316 or via one or more wired communications interfaces (e.g., Universal Serial Bus or USB); one or more wireless communications interfaces (e.g., Bluetooth®, Near Field Communication or NFC); one or more wired network interfaces (e.g., IEEE 802.3 or Ethernet); and/or one or more wireless network interfaces (e.g., IEEE 802.11 or WiFi®).

Machine-readable instruction sets 338 and other modules 340 may be stored in whole or in part in the system memory 320. Such instruction sets 338 may be transferred, in whole or in part, from the one or more data storage devices 330. The instruction sets 338 may be loaded, stored, or otherwise retained in system memory 320, in whole or in part, during execution by the processor circuitry 310. The machine-readable instruction sets 338 may include machine-readable and/or processor-readable code, instructions, or similar logic capable of providing the speech coaching functions and capabilities described herein.

A system user may provide, enter, or otherwise supply commands (e.g., selections, acknowledgements, confirmations, and similar) as well as information and/or data (e.g., subject identification information, color parameters) to the processor-based device 300 using one or more communicably coupled input devices 350. The one or more communicably coupled input devices 350 may be disposed local to or remote from the processor-based device 300. The input devices 350 may include one or more: text entry devices 351 (e.g., keyboard); pointing devices 352 (e.g., mouse, trackball, touchscreen); audio input devices 353; video input devices 354; and/or biometric input devices 355 (e.g., fingerprint scanner, facial recognition, iris print scanner, voice recognition circuitry). In embodiments, at least some of the one or more input devices 350 may include a wired or wireless interface that communicably couples the input device 350 to the processor-based device 300.

The system user may receive output from the processor-based device 300 via one or more output devices 360. In at least some implementations, the one or more output devices 360 may include, but are not limited to, one or more: biometric output devices 361; visual output or display devices 362; tactile output devices 363; audio output devices 364, or combinations thereof. In embodiments, at least some of the one or more output devices 360 may include a wired or a wireless communicable coupling to the processor-based device 300.

For convenience, a network interface 370, the processor circuitry 310, the system memory 320, the one or more input devices 350 and the one or more output devices 360 are illustrated as communicatively coupled to each other via the communications link 316, thereby providing connectivity between the above-described components. In alternative embodiments, the above-described components may be communicatively coupled in a different manner than illustrated in FIG. 3. For example, one or more of the above-described components may be directly coupled to other components, or may be coupled to each other, via one or more intermediary components (not shown). In some embodiments, all or a portion of the communications link 316 may be omitted and the components are coupled directly to each other using suitable wired or wireless connections.

Figure 4:
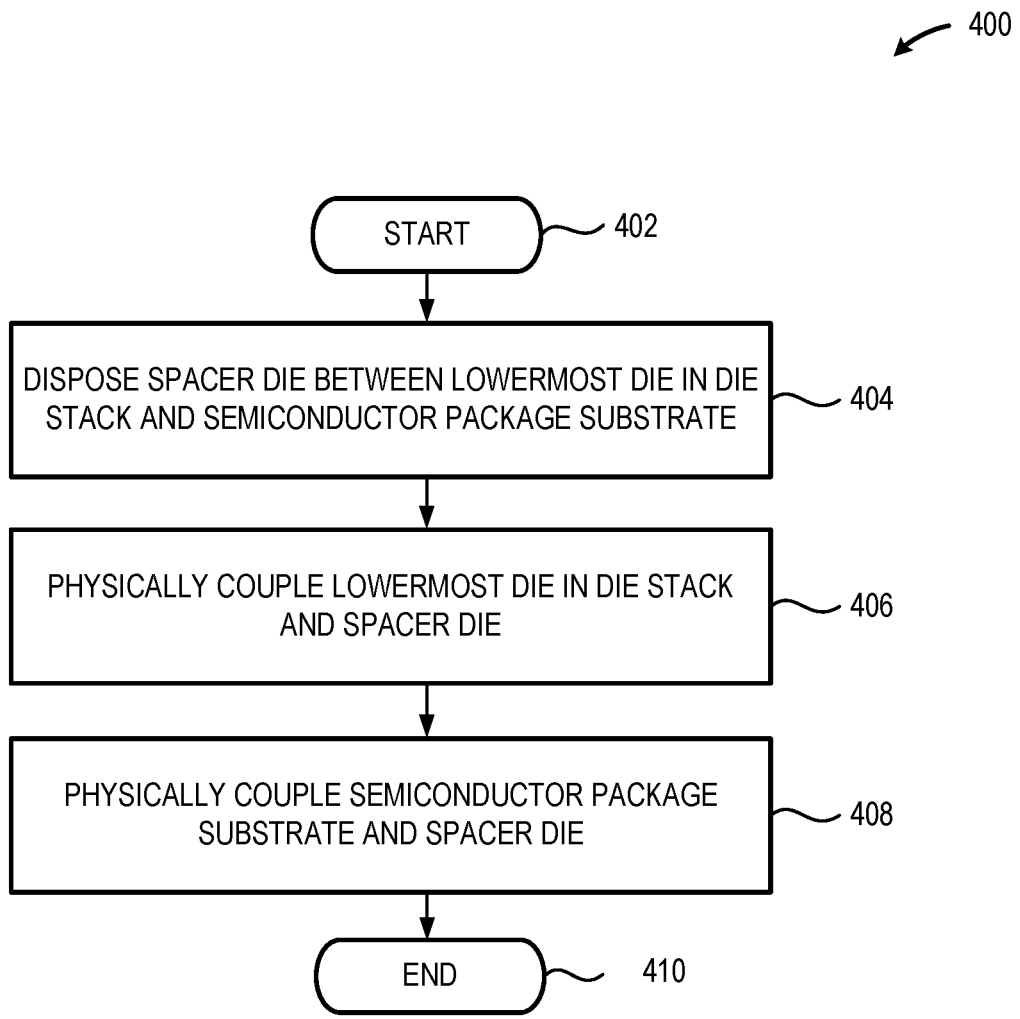
FIG. 4 is a high-level logic flow diagram of an illustrative stacked die semiconductor packaging method using a spacer die to transfer thermally-induced shear stress from electrical contact pads and conductive structures to mechanical contact pads and physical structures, in accordance with at least one embodiment described herein.

FIG. 4 is a high-level logic flow diagram of an illustrative stacked die semiconductor packaging method 400 using a spacer die 140 to transfer thermally-induced shear stress from electrical contact pads 150 and conductive structures 180 to mechanical contact pads 160 and physical structures 182, in accordance with at least one embodiment described herein. During routine operation, stacked dies generate heat, causing a thermal expansion of the die stack 120 and the substrate 130 to which the die stack 120 is coupled. The heat also causes the underlying support structure (e.g., printed circuit board) 170 to expand. The differential expansion between the semiconductor die 120/substrate 130 and the underlying structure 170 to which the semiconductor package 110 is coupled creates stresses within the conductive structures 180 that can lead to premature failure (e.g., fracturing) of the conductive structures 180 and premature device failure. The use of a spacer die 140 between the semiconductor die 120 and the semiconductor package substrate 130 transfers at least a portion of the thermally-induced stress to physical support structures 182 that provide physical support and typically do not have communication functionality. It has been found that by translating the stresses to such physical support structures 182 can beneficially and advantageously prolong the effective life of the conductive structures by 2-3 time. The method commences at 402.

At 404, a spacer die 140 is disposed between one or more die stacks 120 and the semiconductor package substrate 130. In embodiments, the footprint area of the spacer die 140 is greater in area than the sum of the footprint areas of the one or more die stacks 120 and less than the footprint area of the semiconductor package substrate 130. In some implementations, the footprint area of the spacer die 140 may be the same as the footprint area of the semiconductor package substrate 130. In some implementations, the spacer die 140 may be formed integral with (e.g., as an additional layer in, on, or about) the semiconductor package substrate 130.

At 406, the bottom surface of the lowermost die 120A in the die stack is physically coupled to the upper surface 142 of the spacer die 140. The physical coupling of the lowermost die 120A to the upper surface 142 of the spacer die 140 may be accomplished using any currently available or future developed die attachment method or process. For example, the lowermost die 120A may be physically coupled to the upper surface 142 of the spacer die 140 using a die attach adhesive or a die attach film.

At 408, the lower surface 144 of the spacer die 140 is physically coupled to the upper surface 132 of the semiconductor package substrate 130. The physical coupling of the lower surface 144 of the spacer die 140 to the upper surface 132 of the semiconductor package substrate 130 may be accomplished using any currently available or future developed die attachment method or process. For example, the lower surface 144 of the spacer die 140 may be physically coupled to the upper surface 132 of the semiconductor package substrate 130 using a die attach adhesive or a die attach film. The method 400 concludes at 410.

Figure 5:
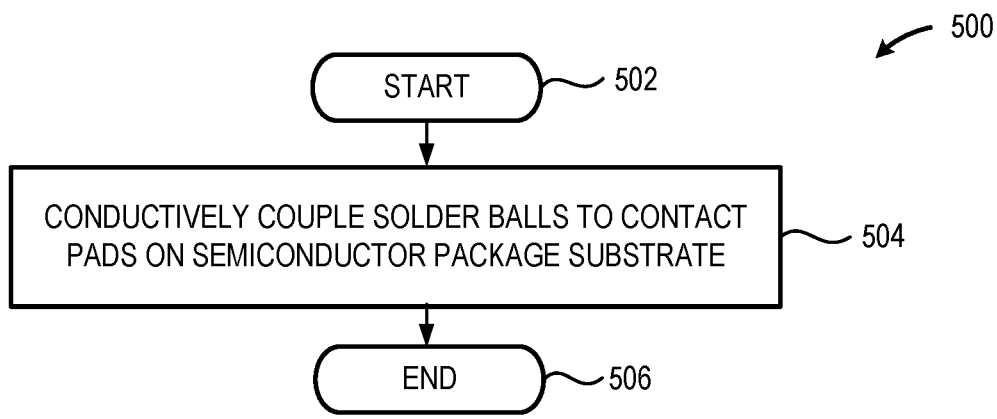
FIG. 5 is a high-level logic flow diagram of an illustrative stacked die semiconductor packaging method using a spacer die to transfer thermally-induced shear stress from electrical contact pads and conductive structures to mechanical contact pads and physical structures 182, in accordance with at least one embodiment described herein.

FIG. 5 is a high-level logic flow diagram of an illustrative stacked die semiconductor packaging method 500 using a spacer die 140 to transfer thermally-induced shear stress from electrical contact pads 150 and conductive structures 180 to mechanical contact pads 160 and physical structures 182, in accordance with at least one embodiment described herein. The method 500 may be used in conjunction with the method 400 described above in FIG. 4. In embodiments, the semiconductor package substrate 130 may be physically coupled to the underlying structure 170 via a plurality of mechanical structures 182 and/or a plurality of electrical structures 180. In embodiments, either or both the electrical structures 180 and/or the mechanical structures 182 may include solder balls, solder bumps, or similar structures. The method 500 commences at 502.

At 504, solder balls are conductively coupled to contact pads disposed on the lower surface 134 of the semiconductor package substrate 130. In embodiments, solder balls may form all or a portion of the electrical structures 180 and may be conductively coupled to corresponding electrical contact pads 150 on the lower surface 134 of the semiconductor package substrate 130. In embodiments, solder balls may form all or a portion of the mechanical structures 182 and may be physically coupled to corresponding mechanical contact pads 160 on the lower surface 134 of the semiconductor package substrate 130. The method 500 concludes at 506.

Figure 6:
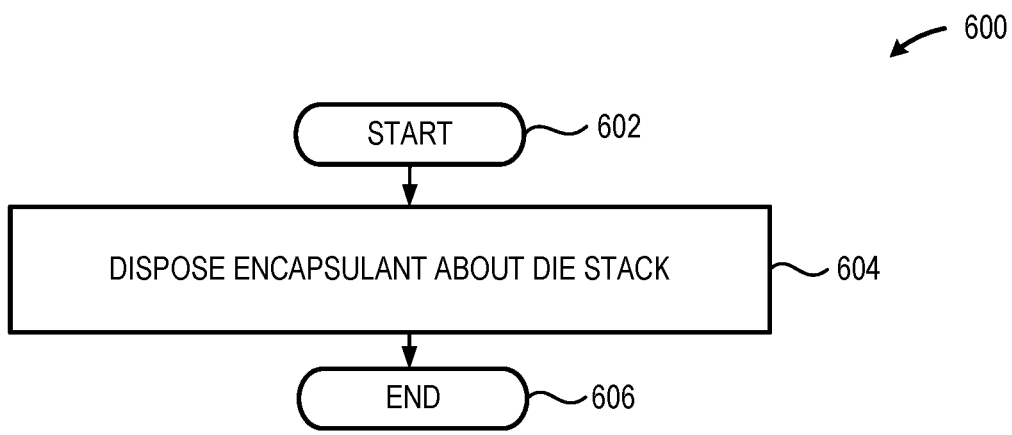
FIG. 6 is a high-level logic flow diagram of an illustrative stacked die semiconductor packaging method using a spacer die to transfer thermally-induced shear stress from electrical contact pads and conductive structures to mechanical contact pads and physical structures, in accordance with at least one embodiment described herein.

FIG. 6 is a high-level logic flow diagram of an illustrative stacked die semiconductor packaging method 600 using a spacer die 140 to transfer thermally-induced shear stress from electrical contact pads 150 and conductive structures 180 to mechanical contact pads 160 and physical structures 182, in accordance with at least one embodiment described herein. The method 600 may be used in conjunction with the method 400 described above in FIG. 4 and/or the method 500 described above in FIG. 5. In embodiments, and encapsulant may be disposed partially or completely about the die stack(s) 120 to form the semiconductor package 100 described above in FIGS. 1A and 1B and the semiconductor package 200 described above in FIGS. 2A and 2B. The method 600 commences at 602.

At 604, an encapsulant is disposed at least partially about the die stack(s) 120 included in the semiconductor package 100 and/or the semiconductor package 200. In embodiments, the encapsulant may include one or more dielectric materials. In embodiments, the encapsulant may include one or more electrically insulative materials. The method 600 concludes at 606.

Figure 7:
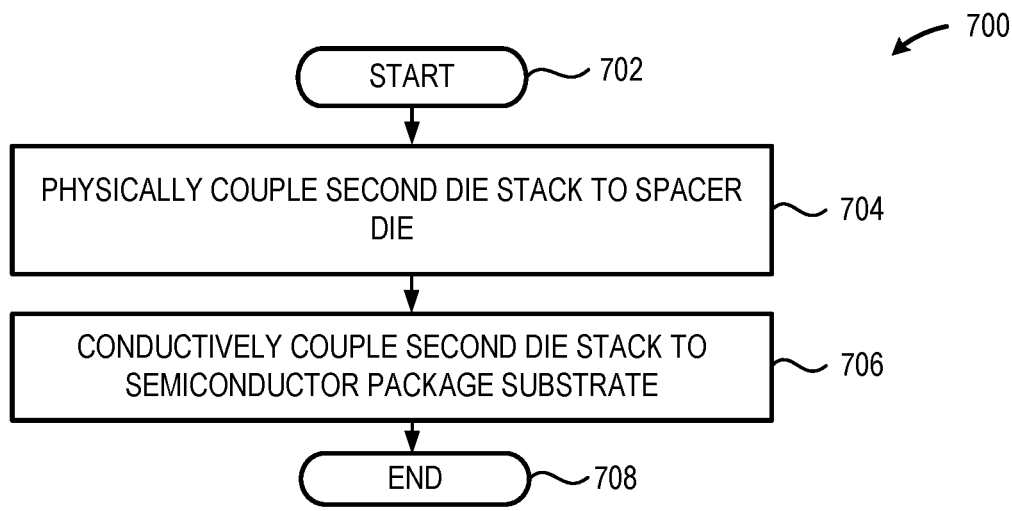
FIG. 7 is a high-level logic flow diagram of an illustrative stacked die semiconductor packaging method using a spacer die to transfer thermally-induced shear stress from electrical contact pads and conductive structures to mechanical contact pads and physical structures, in accordance with at least one embodiment described herein.

FIG. 7 is a high-level logic flow diagram of an illustrative stacked die semiconductor packaging method 700 using a spacer die 140 to transfer thermally-induced shear stress from electrical contact pads 150 and conductive structures 180 to mechanical contact pads 160 and physical structures 182, in accordance with at least one embodiment described herein. The method 600 may be used in conjunction with the method 400 described above in FIG. 4, the method 500 described above in FIG. 5 and/or the method 600 described above in FIG. 6. In embodiments, any number of die stacks 120 may be disposed proximate the upper surface 142 of the spacer die 140. The method 700 commences at 702.

At 704, a second die stack 120₂ may be physically coupled to the upper surface 142 of the spacer die 140. In embodiments, a plurality of wirebonds 190 may communicably couple the second die stack 120₂ to the semiconductor package substrate 130. The method 700 concludes at 706.

While FIGS. 4 through 7 illustrate various operations according to one or more embodiments, it is to be understood that not all of the operations depicted in FIGS. 4 through 7 are necessary for other embodiments. Indeed, it is fully contemplated herein that in other embodiments of the present disclosure, the operations depicted in FIGS. 4 through 7, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), rewritable compact disks (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software executed by a programmable control device.

Thus, the present disclosure is directed to stacked die semiconductor packages that include a spacer die disposed between the stacked die and the semiconductor package substrate. The spacer die translates thermally induced stresses on the solder connections between the substrate and an underlying member, such as a printed circuit board, from electrical structures communicably or conductively coupling the semiconductor package substrate to the underlying structure to mechanical structures that physically couple the semiconductor package to the underlying structure. The footprint area of the spacer die is greater than the sum of the footprint areas of the individual stacked dies in the semiconductor package and less than or equal to the footprint area of the semiconductor package substrate. The spacer die may have nay physical configuration, thickness, shape, or geometry. The spacer die may have a coefficient of thermal expansion similar to that of the lowermost semiconductor die in the die stack.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for reducing the occurrence of failed electrical structures that communicably couple a stacked die semiconductor package to an underlying structure having a different coefficient of thermal expansion by fabricating a stacked die semiconductor package that includes a spacer die disposed between one or more stacked dies and the semiconductor package substrate.

According to example 1, there is provided a semiconductor package. The semiconductor package may include: a substrate having an upper surface, a transversely opposed second surface, and a substrate footprint area and a contact pad array disposed on the second surface of the substrate; where the contact pad array includes a plurality of contact pads arranged in a first pattern; and where the first pattern includes a plurality of peripheral contact pads; a first die stack having a first die stack footprint area; the first die stack footprint area less than the substrate footprint area; and a spacer die disposed between the upper surface of the substrate and first die stack the spacer die having a footprint area that is greater than the first die stack footprint area and the same or smaller than the substrate footprint area; where the first die stack communicably couples to the upper surface of the spacer die in a location such that the first die stack footprint area partially shadows a portion of the plurality of peripheral contact pads; and where the spacer die footprint area completely shadows the portion of the plurality of peripheral contact pads at least partially shadowed by the first die stack footprint.

Example 2 may include elements of example 1, and the semiconductor package may additionally include a plurality of solder balls, each of the plurality of solder balls conductively coupled to a respective one of the plurality of contact pads.

Example 3 may include elements of example 1, and the semiconductor package may additionally include an encapsulant disposed about at least a portion of the first die stack.

Example 4 may include elements of example 1, and the semiconductor package may additionally include: a second die stack having a second die stack footprint area; where a combined footprint area of the first die stack and the second die stack is less than the substrate footprint area; where the first die stack and the second die stack footprint are spaced apart to provide an interstitial space between the first die stack footprint and the second die stack footprint; where at least some of the plurality contact pads are disposed on the second surface of the substrate in the interstitial space between the first die stack footprint and the second die stack footprint such that the contact pads disposed in the interstitial space are partially shadowed by at least one of: the first die stack footprint or the second die stack footprint; where the spacer die is disposed between the upper surface of the substrate and the first and the second die stacks; and where the spacer die footprint area completely shadows the portion of the plurality of peripheral contact pads at least partially shadowed by the first die stack footprint and the contact pads disposed in the interstitial space between the first die stack and the second die stack.

Example 5 may include elements of example 4 where the second die stack communicably couples to the upper surface of the spacer die in a location such that the second die stack footprint partially shadows a portion of the plurality of peripheral contact pads; where the spacer die footprint area completely shadows the portion of the plurality of peripheral contact pads at least partially shadowed by the footprint of the second die stack.

Example 6 may include elements of example 4 where the first die stack and the second die stack may include a system on a chip (SoC).

Example 7 may include elements of any of examples 1 through 6 where the spacer die may include a silicon spacer die.

Example 8 may include elements of example 7 where the silicon spacer die comprises a silicon-containing material having a thickness of from about 10 micrometers (μm) to 100 μm.

Example 9 may include elements of any of examples 1 through 6, and the semiconductor package may additionally include a die attach film disposed between the first die stack and the spacer die; where the die attach film comprises a material having a first modulus of elasticity; where the spacer die comprises a material having a second modulus of elasticity; and where a difference between the first modulus of elasticity and the second modulus of elasticity is less than 10% of the larger of the first modulus of elasticity or the second modulus of elasticity.

According to example 10, there is provided a semiconductor package fabrication method. The method may include: disposing a spacer die between a first die stack and a first surface of a substrate such that a first die stack footprint partially shadows a portion of each of a plurality of contact pads disposed on a second surface of the substrate; coupling the first die stack to a first side of the spacer die, the spacer die having a footprint that is greater than the first die stack footprint; and coupling the substrate to a second side of the spacer die, the second side of the spacer die transversely opposed to the first side of the spacer die, the spacer die having a footprint that is the same or smaller than the substrate footprint, the spacer die footprint shadowing the plurality of contact pads at least partially shadowed by the footprint of the first die stack.

Example 11 may include elements of example 10, and the method may additionally include: conductively coupling each of a plurality of solder balls to a respective one of the plurality of contact pads.

Example 12 may include elements of example 10, and the method may additionally include: disposing an encapsulant about at least a portion of the first die stack.

Example 13 may include elements of example 10, and the method may additionally include: coupling a second die stack having a second die stack footprint area to the first side of the spacer die; where a combined footprint area of the first die stack and the second die stack is less than the substrate footprint area; where the first die stack and the second die stack footprint are spaced apart to provide an interstitial space between the first die stack footprint and the second die stack footprint; where at least some of the plurality contact pads are disposed on the second surface of the substrate in the interstitial space between the first die stack footprint and the second die stack footprint such that the contact pads disposed in the interstitial space are partially shadowed by at least one of: the first die stack footprint or the second die stack footprint; where the spacer die is disposed between the upper surface of the substrate and the first and the second die stacks; and where the spacer die footprint area completely shadows the portion of the plurality of peripheral contact pads at least partially shadowed by the first die stack footprint and the contact pads disposed in the interstitial space between the first die stack and the second die stack.

Example 14 may include elements of example 13 where coupling a second die stack having a second die stack footprint area to the spacer die may include: coupling the second die stack to the spacer die in a location such that second die stack footprint partially shadows a portion of the plurality of contact pads disposed about a periphery of the plurality of contact pads; and where the spacer die footprint area completely shadows the portion of the plurality of peripheral contact pads at least partially shadowed by the footprint of the second die stack.

Example 15 may include elements of example 14 where coupling the first die stack to a first side of the spacer die and the second die stack having a second die stack footprint area to the spacer die may include: coupling a system on a chip (SoC) that includes the first die stack and the second die stack to the first side of the spacer die.

Example 16 may include elements of any of examples 10 through 15 where disposing a spacer die between a first die stack and a first surface of a substrate may include: disposing a spacer die comprising a silicon spacer die between a first die stack and a first surface of a substrate.

Example 17 may include elements of example 16 where disposing a spacer die comprising a silicon spacer die between a first die stack and a first surface of a substrate may include: disposing a spacer die that includes a silicon-containing material having a thickness of from about 10 micrometers (µm) to 100 µm between the first die stack and the first surface of the substrate.

Example 18 may include elements of any of examples 10 through 15 where coupling the first die stack to a first side of the spacer die further may include: coupling the first die stack to a first side of the spacer die using die attach film disposed between the first die stack and the spacer die; where the die attach film comprises a material having a first modulus of elasticity; and where disposing a spacer die between a first die stack and a first surface of a substrate may include: disposing a spacer die that includes a material having a second modulus of elasticity between a first die stack and a first surface of a substrate wherein the spacer die; where a difference between the first modulus of elasticity and the second modulus of elasticity is less than 10% of the larger of the first modulus of elasticity or the second modulus of elasticity.

According to example 19, there is provided a semiconductor package fabrication system. The system may include: means for disposing a spacer die between a first die stack and a first surface of a substrate such that a first die stack footprint partially shadows a portion of each of a plurality of contact pads disposed on a second surface of the substrate; means for coupling the first die stack to a first side of the spacer die, the spacer die having a footprint that is greater than the first die stack footprint; and means for coupling the substrate to a second side of the spacer die, the second side of the spacer die transversely opposed to the first side of the spacer die, the spacer die having a footprint that is the same or smaller than the substrate footprint, the spacer die footprint shadowing the plurality of contact pads at least partially shadowed by the footprint of the first die stack.

Example 20 may include elements of example 19, and the system may additionally include: means for conductively coupling each of a plurality of solder balls to a respective one of the plurality of contact pads.

Example 21 may include elements of example 19, and the system may additionally include: means for disposing an encapsulant about at least a portion of the first die stack.

Example 22 may include elements of example 19, and the system may additionally include: means for coupling a second die stack having a second die stack footprint area to the first side of the spacer die; where a combined footprint area of the first die stack and the second die stack is less than the substrate footprint area; where the first die stack and the second die stack footprint are spaced apart to provide an interstitial space between the first die stack footprint and the second die stack footprint; where at least some of the plurality contact pads are disposed on the second surface of the substrate in the interstitial space between the first die stack footprint and the second die stack footprint such that the contact pads disposed in the interstitial space are partially shadowed by at least one of: the first die stack footprint or the second die stack footprint; where the spacer die is disposed between the upper surface of the substrate and the first and the second die stacks; and where the spacer die footprint area completely shadows the portion of the plurality of peripheral contact pads at least partially shadowed by the first die stack footprint and the contact pads disposed in the interstitial space between the first die stack and the second die stack.

Example 23 may include elements of example 22 where the means for coupling a second die stack having a second die stack footprint area to the spacer die may include: means for coupling the second die stack to the spacer die in a location such that the second die stack footprint partially shadows a portion of the plurality of contact pads disposed about a periphery of the plurality of contact pads; where the spacer die footprint area completely shadows the portion of the plurality of peripheral contact pads at least partially shadowed by the footprint of the second die stack.

Example 24 may include elements of example 23 where the means for coupling the first die stack to a first side of the spacer die and the second die stack having a second die stack footprint area to the spacer die may include: means for coupling a system on a chip (SoC) that includes the first die stack and the second die stack to the first side of the spacer die.

Example 25 may include elements of any of claims 19 through 24 where the means for disposing a spacer die between a first die stack and a first surface of a substrate may include: means for disposing a spacer die comprising a silicon spacer die between a first die stack and a first surface of a substrate.

Example 26 may include elements of example 25 where the means for disposing a spacer die comprising a silicon spacer die between a first die stack and a first surface of a substrate may include: means for disposing a spacer die that includes a silicon-containing material having a thickness of from about 10 micrometers (µm) to 100 µm between the first die stack and the first surface of the substrate.

Example 27 may include elements of any of examples 19 through 24 where the means for coupling the first die stack to a first side of the spacer die may further include: means for coupling the first die stack to a first side of the spacer die using die attach film disposed between the first die stack and the spacer die; where the die attach film comprises a material having a first modulus of elasticity; and where the means for disposing a spacer die between a first die stack and a first surface of a substrate may include: means for disposing a spacer die that includes a material having a second modulus of elasticity between a first die stack and a first surface of a substrate wherein the spacer die; where a difference between the first modulus of elasticity and the second modulus of elasticity is less than 10% of the larger of the first modulus of elasticity or the second modulus of elasticity.

According to example 28, there is provided an electronic device. The electronic device may include: a printed circuit board; and a semiconductor package communicably coupled to the printed circuit board, the semiconductor package including: a substrate having an upper surface, a transversely opposed second surface, and a substrate footprint area and a contact pad array disposed on the second surface of the substrate; where the contact pad array includes a plurality of contact pads arranged in a first pattern; and where the first pattern includes a plurality of peripheral contact pads; a first die stack having a first die stack footprint area; the first die stack footprint area less than the substrate footprint area; and a spacer die disposed between the upper surface of the substrate and first die stack the spacer die having a footprint area that is greater than the first die stack footprint area and the same or smaller than the substrate footprint area; where the first die stack communicably couples to the upper surface of the spacer die in a location such that the first die stack footprint area partially shadows a portion of the plurality of peripheral contact pads; and where the spacer die footprint area completely shadows the portion of the plurality of peripheral contact pads at least partially shadowed by the first die stack footprint.

Example 29 may include elements of example 28 where the semiconductor package may further include: a plurality of solder balls, each of the plurality of solder balls conductively coupled to a respective one of the plurality of contact pads, each of the plurality of solder balls physically coupling the semiconductor package to the printed circuit board.

Example 30 may include elements of example 28 where the semiconductor package may further include: an encapsulant disposed about at least a portion of the first die stack.

Example 31 may include elements of example 28 where the semiconductor package may further include: a second die stack having a second die stack footprint area; where a combined footprint area of the first die stack and the second die stack is less than the substrate footprint area; where the first die stack and the second die stack footprint are spaced apart to provide an interstitial space between the first die stack footprint and the second die stack footprint; where at least some of the plurality contact pads are disposed on the second surface of the substrate in the interstitial space between the first die stack footprint and the second die stack footprint such that the contact pads disposed in the interstitial space are partially shadowed by at least one of: the first die stack footprint or the second die stack footprint; where the spacer die is disposed between the upper surface of the substrate and the first and the second die stacks; and where the spacer die footprint area completely shadows the portion of the plurality of peripheral contact pads at least partially shadowed by the first die stack footprint and the contact pads disposed in the interstitial space between the first die stack and the second die stack.

Example 32 may include elements of example 31 where the second die stack communicably couples to the upper surface of the spacer die in a location such that the second die stack footprint partially shadows a portion of the plurality of peripheral contact pads; where the spacer die footprint area completely shadows the portion of the plurality of peripheral contact pads at least partially shadowed by the footprint of the second die stack.

Example 33 may include elements of example 32 where the first die stack and the second die stack includes a system on a chip (SoC).

Example 34 may include elements of any of claims 28 through 33 where the spacer die comprises a silicon spacer die.

Example 35 may include elements of example 34 where the silicon spacer die comprises a silicon-containing material having a thickness of from about 10 micrometers (µm) to 100 µm.

Example 36 may include elements of any of claims 28 through 33 where the semiconductor package further includes a die attach film disposed between the first die stack and the spacer die; where the die attach film comprises a material having a first modulus of elasticity; where the spacer die comprises a material having a second modulus of elasticity; and where a difference between the first modulus of elasticity and the second modulus of elasticity is less than 10% of the larger of the first modulus of elasticity or the second modulus of elasticity.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. A semiconductor package comprising:
   a substrate having an upper surface, a transversely opposed second surface, and a substrate footprint area and a contact pad array disposed on the second surface of the substrate;
   wherein the contact pad array includes a plurality of contact pads arranged in a first pattern; and
   wherein the first pattern includes a plurality of peripheral electrical contact pads and a plurality of mechanical contact pads;
   a first die stack having a first die stack footprint area, the first die stack comprising a first die vertically over a second die, the first die having a footprint smaller than and entirely within a footprint of the second die, and the first die stack footprint area less than the substrate footprint area; and
   a spacer die disposed between the upper surface of the substrate and first die stack the spacer die having a footprint area that is greater than the first die stack footprint area and the same or smaller than the substrate footprint area;
   wherein the first die stack physically couples to the upper surface of the spacer die in a location such that the first die stack footprint area partially overlaps a portion of the plurality of peripheral electrical contact pads from a plan view perspective, wherein the plurality of mechanical contact pads is outside of the first die stack footprint area; and
   wherein the spacer die footprint area completely overlaps the portion of the plurality of peripheral electrical contact pads at least partially overlapped by the first die stack footprint from the plan view perspective, wherein the spacer die footprint area overlaps the plurality of mechanical contact pads, and wherein there are no contact pads on the second surface of the substrate outside of the spacer die footprint area.

2. The semiconductor package of claim 1, further comprising:
   a plurality of solder balls, each of the plurality of solder balls conductively coupled to a respective one of the plurality of contact pads.

3. The semiconductor package of claim 1, further comprising:
   an encapsulant disposed about at least a portion of the first die stack.

4. The semiconductor package of claim 1, further comprising:
   a second die stack having a second die stack footprint area;
   wherein a combined footprint area of the first die stack and the second die stack is less than the substrate footprint area;

wherein the first die stack and the second die stack footprint are spaced apart to provide an interstitial space between the first die stack footprint and the second die stack footprint;

wherein at least some of the plurality contact pads are disposed on the second surface of the substrate in the interstitial space between the first die stack footprint and the second die stack footprint such that the contact pads disposed in the interstitial space are partially overlapped from the plan view perspective by at least one of:

the first die stack footprint or the second die stack footprint;

wherein the spacer die is disposed between the upper surface of the substrate and the first and the second die stacks; and wherein the spacer die footprint area completely overlaps the portion of the plurality of peripheral electrical contact pads at least partially overlapped by the first die stack footprint and the contact pads disposed in the interstitial space between the first die stack and the second die stack from the plan view perspective.

5. The semiconductor package of claim 4:

wherein the second die stack communicably couples to the upper surface of the spacer die in a location such that the second die stack footprint partially overlaps a portion of the plurality of peripheral electrical contact pads from the plan view perspective;

wherein the spacer die footprint area completely overlaps the portion of the plurality of peripheral electrical contact pads at least partially overlapped by the footprint of the second die stack from the plan view perspective.

6. The semiconductor package of claim 4 wherein the first die stack and the second die stack comprise a system on a chip (SoC).

7. The semiconductor package of claim 1 wherein the spacer die comprises a silicon spacer die.

8. The semiconductor package of claim 7 wherein the silicon spacer die comprises a silicon-containing material having a thickness of from about 10 micrometers (µm) to 100 µm.

9. The semiconductor package of claim 1, further comprising a die attach film disposed between the first die stack and the spacer die;

wherein the die attach film comprises a material having a first modulus of elasticity;

wherein the spacer die comprises a material having a second modulus of elasticity; and wherein a difference between the first modulus of elasticity and the second modulus of elasticity is less than 10% of the larger of the first modulus of elasticity or the second modulus of elasticity.

* * * * *